United States Patent
Calundann et al.

(10) Patent No.: US 8,716,356 B2
(45) Date of Patent: *May 6, 2014

(54) PROTON-CONDUCTING MEMBRANE AND ITS USE

(75) Inventors: Gordon Calundann, North Plainfield, NJ (US); Brian Benicewicz, Loudonville, NY (US); Jochen Baurmeister, Eppstein (DE)

(73) Assignee: BASF Fuel Cell GmbH (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/617,227

(22) Filed: Sep. 14, 2012

(65) Prior Publication Data

US 2013/0012607 A1   Jan. 10, 2013

Related U.S. Application Data

(62) Division of application No. 12/889,965, filed on Sep. 24, 2010, now Pat. No. 8,277,983, which is a division of application No. 10/527,649, filed as application No. PCT/EP03/09198 on Aug. 20, 2003, now abandoned.

(30) Foreign Application Priority Data

Sep. 13, 2002   (DE) ................. 102 42 708

(51) Int. Cl.
*C08J 5/20* (2006.01)
*H01M 8/00* (2006.01)

(52) U.S. Cl.
USPC ............. 521/25; 521/27; 521/30; 521/31; 521/32; 528/480; 528/486; 528/487; 528/502 R; 528/503; 429/400

(58) Field of Classification Search
USPC ............ 521/25, 27, 30, 31, 32; 528/480, 486, 528/487, 502 R, 503; 429/400
See application file for complete search history.

(56) References Cited

U.S. PATENT DOCUMENTS

| | | | |
|---|---|---|---|
| 3,313,783 A | 4/1967 | Iwakura et al. | |
| 3,737,042 A | 6/1973 | Boom | |
| 3,841,492 A | 10/1974 | Brinegar | |
| 4,020,142 A | 4/1977 | Davis et al. | |
| 4,154,919 A | 5/1979 | Sheratte | |
| 4,191,618 A | 3/1980 | Coker et al. | |
| 4,212,714 A | 7/1980 | Coker et al. | |
| 4,312,976 A | 1/1982 | Choe | |
| 4,333,805 A | 6/1982 | Davidson et al. | |
| 4,486,687 A | 12/1984 | Epsztein | |
| 4,512,894 A | 4/1985 | Wang | |
| 4,693,815 A | 9/1987 | Collins, Jr. | |
| 4,693,824 A | 9/1987 | Sansone | |
| 4,810,730 A | 3/1989 | Letinski et al. | |
| 5,017,681 A | 5/1991 | Wadhwa et al. | |
| 5,098,985 A | 3/1992 | Harris et al. | |
| 5,218,076 A | 6/1993 | Madison et al. | |
| 5,312,895 A | 5/1994 | Dang et al. | |
| 5,409,524 A | 4/1995 | Jensvold et al. | |
| 5,492,996 A | 2/1996 | Dang et al. | |
| 5,525,436 A | 6/1996 | Savinell et al. | |
| 5,633,337 A | 5/1997 | Tan et al. | |
| 5,674,969 A | 10/1997 | Sikkema et al. | |
| 6,151,042 A | 11/2000 | Smith et al. | |
| 7,332,530 B2 | 2/2008 | Kiefer et al. | |
| 7,384,552 B2 | 6/2008 | Calundann et al. | |
| 7,540,984 B2 | 6/2009 | Calundann et al. | |
| 7,582,210 B2 | 9/2009 | Calundann et al. | |
| 8,277,983 B2* | 10/2012 | Calundann et al. ........... 429/400 |
| 2004/0062969 A1 | 4/2004 | Sakaguchi et al. | |
| 2004/0096734 A1 | 5/2004 | Calundann et al. | |
| 2004/0127588 A1 | 7/2004 | Calumdann et al. | |
| 2004/0131909 A1 | 7/2004 | Soczka-Guth et al. | |
| 2004/0247974 A1 | 12/2004 | Uensal et al. | |
| 2004/0262227 A1 | 12/2004 | Kiefer et al. | |
| 2005/0053820 A1 | 3/2005 | Calundann et al. | |
| 2005/0074654 A1 | 4/2005 | Kiefer et al. | |
| 2005/0084727 A1 | 4/2005 | Kiefer et al. | |
| 2005/0118477 A1 | 6/2005 | Kiefer et al. | |
| 2005/0118478 A1 | 6/2005 | Kiefer et al. | |
| 2005/0147859 A1 | 7/2005 | Kiefer et al. | |
| 2005/0175879 A1 | 8/2005 | Kiefer et al. | |
| 2005/0181254 A1 | 8/2005 | Uensal et al. | |
| 2005/0244694 A1 | 11/2005 | Kiefer et al. | |
| 2005/0256296 A1 | 11/2005 | Kiefer et al. | |
| 2006/0008690 A1 | 1/2006 | Uensal et al. | |

(Continued)

FOREIGN PATENT DOCUMENTS

| | | |
|---|---|---|
| CA | 2448447 A1 | 1/2003 |
| CA | 2459775 A2 | 3/2004 |
| DE | 101 09 829 | 9/2002 |
| DE | 101 17 686 A1 | 10/2002 |
| EP | 0476560 A1 | 3/1992 |
| EP | 1354907 | 10/2003 |
| JP | 2001-118591 A | 4/2001 |
| WO | WO-98/14505 | 4/1998 |
| WO | WO-02/36249 A1 | 5/2002 |
| WO | WO-02/38650 A1 | 5/2002 |
| WO | WO-02/081547 A1 | 10/2002 |
| WO | WO-02/088219 A1 | 11/2002 |
| WO | WO-02/102881 A1 | 12/2002 |
| WO | WO-03/007411 A2 | 1/2003 |
| WO | WO-03/022412 A2 | 3/2003 |
| WO | WO-03/022412 A3 | 3/2003 |
| WO | WO-2005/007725 | 1/2005 |
| WO | WO-2005/023914 | 3/2005 |
| WO | WO-2006/117199 A1 | 11/2006 |

OTHER PUBLICATIONS

Dealy et al. "Structure and Rheology Molten Polymers From Structure to Flow Behavior and Back Again," Hanser Publishers, section 2.5.1, 2006.
Kirk-Othmer (Kirk-Othmer Encyclopedia of Chemical Technology), 4th Edition, vol. 18, 1996, John Wiley & Sons, Inc., pp. 669-718.
Wainright et al. "Acid-Doped polybenzimidazoles: A New Polymer Electrolyte" J. Electrochem,. Soc., vol. 142, No. 7, Jul. 1995.

*Primary Examiner* — Duc Truong
(74) *Attorney, Agent, or Firm* — Novak Druce Connolly Bove + Quigg LLP

(57) ABSTRACT

The present invention relates to novel polyazoles, a proton-conducting polymer membrane based on these polyazoles and its use as polymer electrolyte membrane (PEM) for producing membrane-electrode units for PEM-fuel cells, and also other shaped bodies comprising such polyazoles.

22 Claims, No Drawings

(56) References Cited

U.S. PATENT DOCUMENTS

| | | |
|---|---|---|
| 2006/0057449 A1 | 3/2006 | Calundann et al. |
| 2006/0078774 A1 | 4/2006 | Uensal et al. |
| 2006/0079392 A1 | 4/2006 | Baurmeister et al. |
| 2006/0166067 A1 | 7/2006 | Kiefer et al. |
| 2006/0183012 A1 | 8/2006 | Uensal et al. |
| 2006/0210881 A1 | 9/2006 | Calundann et al. |
| 2006/0234099 A1 | 10/2006 | Muellen |
| 2007/0102361 A1 | 5/2007 | Kiefer et al. |
| 2007/0292734 A1 | 12/2007 | Kiefer et al. |
| 2008/0026277 A1 | 1/2008 | Peterson et al. |
| 2008/0038624 A1 | 2/2008 | Belack et al. |

\* cited by examiner

PROTON-CONDUCTING MEMBRANE AND ITS USE

RELATED APPLICATIONS

This Application is a Division of application Ser. No. 12/889,965 filed on Sep. 24, 2010 now U.S. Pat. No. 8,277,983 which is incorporated by reference. application Ser. No. 12/889,965 is a Division of application Ser. No. 10/527,649 filed on Jul. 12, 2005 now ABN. application Ser. No. 10/527,649 is a national stage application of Application No. PCT/EP2003/009198 filed on Aug. 20, 2003 which claims priority of German Application No. 102 42 708.9 filed on Sep. 13, 2002 in Germany.

The present invention relates to a novel proton-conducting polymer membrane based on polyazoles, which can, owing to its excellent chemical and thermal properties, be used for a variety of purposes and is particularly suitable as polymer electrolyte membrane (PEM) in PEM fuel cells.

Polyazoles such as polybenzimidazoles (®Celazole) have been known for a long time. Such polybenzimidazoles (PBIs) are usually prepared by reacting 3,3',4,4'-tetraminobiphenyl with isophthalic acid or diphenylisophthalic acid or esters thereof in the melt. The resulting prepolymer solidifies in the reactor and is subsequently comminuted mechanically. The pulverulent prepolymer is subsequently fully polymerized in a solid-state polymerization at temperatures of up to 400° C. and the desired polybenzimidazole is obtained.

To produce polymer films, the PBI is, in a further step, dissolved in polar, aprotic solvents such as dimethylacetamide (DMAc) and a film is produced by classical methods.

Proton-conducting, i.e. acid-doped, polyazole membranes for use in PEM fuel cells are already known. The basic polyazole films are doped with concentrated phosphoric acid or sulfuric acid and then act as proton conductors and separators in polymer electrolyte membrane fuel cells (PEM fuel cells).

Due to the excellent properties of the polyazole polymer, such polymer electrolyte membranes can, when processed to produce membrane-electrode units (MEUs), be used in fuel cells at long-term operating temperatures above 100° C., in particular above 120° C. This high long-term operating temperature allows the activity of the catalysts based on noble metals which are present in the membrane-electrode unit (MEU) to be increased. Particularly when using reformates of hydrocarbons, significant amounts of carbon monoxide are present in the reformer gas and these usually have to be removed by means of a costly gas work-up or gas purification. This ability to increase the operating temperature enables significantly higher concentrations of CO impurities to be tolerated over the long term.

The use of polymer electrolyte membranes based on polyazole polymers allows, firstly, the costly gas work-up or gas purification to be omitted in some cases and, secondly, the catalyst loading in the membrane-electrode unit to be reduced. Both are indispensable prerequisites for large-scale use of PEM fuel cells, since otherwise the costs of a PEM fuel cell system are too high.

The previously known acid-doped polymer membranes based on polyazoles display a favorable property profile. However, owing to the applications desired for PEM fuel cells, in particular in the automobile sector and in decentralized power and heat generation (stationary sector), these need to be improved overall. Furthermore, the previously known polymer membranes have a high content of dimethylacetamide (DMAc) which cannot be removed completely by means of known drying methods. The German patent application No. 10109829.4 describes a polymer membrane which is based on polyazoles, and in which the DMAc contamination has been eliminated. Although such polymer membranes display improved mechanical properties, specific conductivities do not exceed 0.1 S/cm (at 140° C.).

It is an object of the present invention to provide acid-containing polymer membranes based on polyazoles, which firstly have the use advantages of the polymer membrane based on polyazoles and, secondly, have an increased specific conductivity, in particular at operating temperatures above 100° C., and make do without additional moistening of the fuel gas.

We have now found that a proton-conducting membrane based on polyazoles can be obtained when the parent monomers are suspended or dissolved in phosphoric acid, spread as a thin layer by means of a doctor blade and polymerized in the phosphoric acid.

In the case of this novel membrane, the specific after-treatment described in the German patent application No. 10109829.4, an additional preparation of a polymer solution and the subsequent doping of the film can be dispensed with. The doped polymer membranes display a significantly improved proton conductivity.

The present invention provides a proton-conducting polymer membrane which is based on polyazoles and is obtainable by a process comprising the steps A) mixing of one or more aromatic tetramino compounds with one or more aromatic carboxylic acids or esters thereof which contain at least two acid groups per carboxylic acid monomer, or mixing of one or more aromatic and/or heteroaromatic diaminocarboxylic acids, in phosphoric acid to form a solution and/or dispersion, B) heating of the solution and/or dispersion obtained in step A) to temperatures of up to 350° C., preferably up to 280° C., to form the polyazole polymer, C) application of a layer using the mixture from step B) to a support or an electrode, D) treatment of the membrane formed in step C) (until it is self-supporting).

The aromatic and heteroaromatic tetramino compounds used according to the invention are preferably 3,3',4,4'-tetraminobiphenyl, 2,3,5,6-tetraminopyridine, 1,2,4,5-tetraminobenzene, bis(3,4-diaminophenyl)sulfone, bis(3,4-diaminophenyl)ether, 3,3',4,4'-tetraminobenzophenone, 3,3',4,4'-tetraminodiphenylmethane and 3,3',4,4'-tetraminodiphenyldimethylmethane and their salts, in particular their monohydrochloride, dihydrochloride, trihydrochloride and tetrahydrochloride derivatives.

The aromatic carboxylic acids used according to the invention are dicarboxylic acids, tricarboxylic acids and tetracarboxylic acids or their esters or their anhydrides or their acid chlorides. The term aromatic carboxylic acids likewise encompasses heteroaromatic carboxylic acids. The aromatic dicarboxylic acids are preferably isophthalic acid, terephthalic acid, phthalic acid, 5-hydroxyisophthalic acid, 4-hydroxyisophthalic acid, 2-hydroxyterephthalic acid, 5-aminoisophthalic acid, 5-N,N-dimethylaminoisophthalic acid, 5-N,N-diethylaminoisophthalic acid, 2,5-dihydroxyterephthalic acid, 2,6-dihydroxyisophthalic acid, 4,6-dihydroxyisophthalic acid, 2,3-dihydroxyphthalic acid, 2,4-dihydroxyphthalic acid, 3,4-dihydroxyphthalic acid, 3-fluorophthalic acid, 5-fluoroisophthalic acid, 2-fluoroterephthalic acid, tetrafluorophthalic acid, tetrafluoroisophthalic acid, tetrafluoroterephthalic acid, 1,4-naphthalenedicarboxylic acid, 1,5-naphthalenedicarboxylic acid, 2,6-naphthalenedicarboxylic acid, 2,7-naphthalenedicarboxylic acid, diphenic acid, 1,8-dihydroxynaphthalene-3,6-dicarboxylic acid, bis(4-carboxyphenyl)ether, benzophenone-4,4'-dicarboxylic acid, bis(4- dicarboxyphenyl)sulfone, biphenyl-4,4'-dicarboxylic acid, 4-trifluoromethylphthalic acid, 2,2-bis(4-carboxyphenyl)hexafluoropropane, 4,4'-stilbenedicarboxylic acid, 4-carboxycinnamic acid, or their C1-C20-alkyl esters or C5-C12-aryl esters, or their acid anhydrides or acid chlorides. The aromatic tricarboxylic acids, tetracarboxylic acids or their C1-C20-alkyl esters or C5-C12-aryl esters or their acid anhydrides or their acid chlorides are preferably 1,3,5-benzenetricarboxylic acid (trimesic acid), 1,2,4-benzenetricarboxylic acid (trimellitic acid), (2-carboxyphenyl)iminodiacetic acid, 3,5,3'-biphenyltricarboxylic acid, 3,5,4'-biphenyltricarboxylic acid.

The aromatic tetracarboxylic acids or their C1-C20-alkyl esters, C5-C12-aryl esters or their acid anhydrides or their acid chlorides are preferably 3,5,3',5'-biphenyltetracarboxylic acid, 1,2,4,5-benzenetetracarboxylic acid, benzophenonetetracarboxylic acid, 3,3',4,4'-biphenyltetracarboxylic acid, 2,2',3,3'-biphenyltetracarboxylic acid, 1,2,5,6-naphthalenetetracarboxylic acid, 1,4,5,8-naphthalenetetracarboxylic acid.

The heteroaromatic carboxylic acids used according to the invention are hetero-aromatic dicarboxylic acids and tricarboxylic acids and tetracarboxylic acids or their esters or their anhydrides. For the purposes of the present invention, heteroaromatic carboxylic acids are aromatic systems in which at least one nitrogen, oxygen, sulfur or phosphorus atom is present in the aromatic. Preference is given to pyridine-2,5-dicarboxylic acid, pyridine-3,5-dicarboxylic acid, pyridine-2,6-dicarboxylic acid, pyridine-2,4-dicarboxylic acid, 4-phenyl-2,5-pyridinedicarboxylic acid, 3,5-pyrazoledicarboxylic acid, 2,6-pyrimidinedicarboxylic acid, 2,5-pyrazinedicarboxylic acid, 2,4,6-pyridinetricarboxylic acid, benzimidazole-5,6-dicarboxylic acid, and also their C1-C20-alkyl esters or C5-C12-aryl esters, or their acid anhydrides or their acid chlorides.

The content of tricarboxylic acids or tetracarboxylic acids (based on dicarboxylic acid used) is in the range from 0 to 30 mol %, preferably from 0.5 to 20 mol %, in particular from 1 to 20 mol %.

The aromatic and heteroaromatic diaminocarboxylic acids used according to the invention are preferably diaminobenzoic acid and its monohydrochloride and dihydrochloride derivatives.

Mixtures of at least 2 different aromatic carboxylic acids are preferably used in step A). Particular preference is given to using mixtures comprising not only aromatic carboxylic acids but also heteroaromatic carboxylic acids. The mixing ratio of aromatic carboxylic acids to heteroaromatic carboxylic acids is from 1:99 to 99:1, preferably from 1:50 to 50:1.

These mixtures are, in particular, mixtures of N-heteroaromatic dicarboxylic acids and aromatic dicarboxylic acids. Nonlimiting examples are isophthalic acid, terephthalic acid, phthalic acid, 2,5-dihydroxyterephthalic acid, 2,6-dihydroxyiso-phthalic acid, 4,6-dihydroxyisophthalic acid, 2,3-dihydroxyphthalic acid, 2,4-dihydroxyphthalic acid, 3,4-dihydroxyphthalic acid, 1,4-naphthalenedicarboxylic acid, 1,5-naphthalenedicarboxylic acid, 2,6-naphthalenedicarboxylic acid, 2,7-naphthalenedicarboxylic acid, diphenic acid, 1,8-dihydroxynaphthalene-3,6-dicarboxylic acid, bis(4-carboxyphenyl)ether, benzophenone-4,4'-dicarboxylic acid, bis(4-carboxyphenyl)sulfone, biphenyl-4,4'-dicarboxylic acid, 4-trifluoromethyl-phthalic acid, pyridine-2,5-dicarboxylic acid, pyridine-3,5-dicarboxylic acid, pyridine-2,6-dicarboxylic acid, pyridine-2,4-dicarboxylic acid, 4-phenyl-2,5-pyridinedicarboxylic acid, 3,5-pyrazoledicarboxylic acid, 2,6-pyrimidinedicarboxylic acid, 2,5-pyrazine-dicarboxylic acid.

The phosphoric acid used in step A) is a commercial phosphoric acid as can be obtained, for example, from Riedel-de Haen.

It is preferably a concentrated phosphoric acid $H_3PO_4$ which usually has a concentration of 85%. More highly concentrated phosphoric acids are also possible, but these contain no polyphosphoric acids $H_{n+2}P_nO_{3n+1}$ ($n \geq 2$).

The mixture produced in step A) has a weight ratio of phosphoric acid to the sum of all monomers of from 1:10 000 to 10 000:1, preferably from 1:1000 to 1000:1, in particular from 1:100 to 100:1.

The polymerization of the mixture from step A) is carried out in step B). For this purpose, the mixture is heated to a temperature of up to 350° C., preferably up to 280° C., in particular up to 250° C. The mixture is preferably heated in a closed reactor, so that the phosphoric acid is not converted into diphosphoric acid ($H_4P_2O_7$), i.e. the simplest form of the polyphosphoric acids $H_{n+2}P_nO_{3n+1}$ (n=2), by elimination of water at above 200° C. The polymerization thus takes place under the partial pressure of water vapor prevailing at the particular temperature. In one variant, the water formed by the polycondensation can be completely or partly removed. This can be effected by separating off the water or by use of anhydrides.

The polyazole-based polymer formed in step B) comprises recurring azole units of the general formula (I) and/or (II) and/or (III) and/or (IV) and/or (V) and/or (VI) and/or (VII) and/or (VIII) and/or (IX) and/or (X) and/or (XI) and/or (XII) and/or (XIII) and/or (XIV) and/or (XV) and/or (XVI) and/or (XVII) and/or (XVIII) and/or (XIX) and/or (XX) and/or (XXI) and/or (XXII)

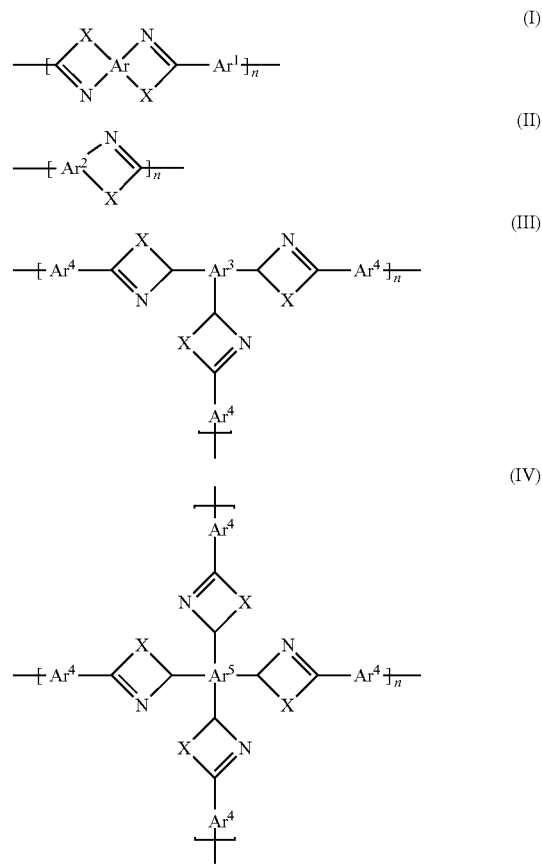

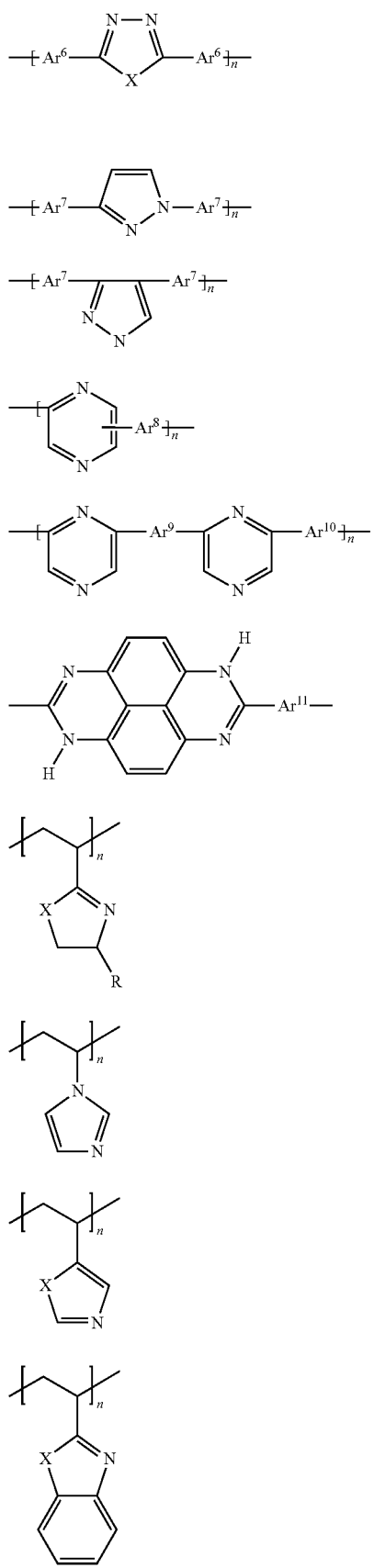
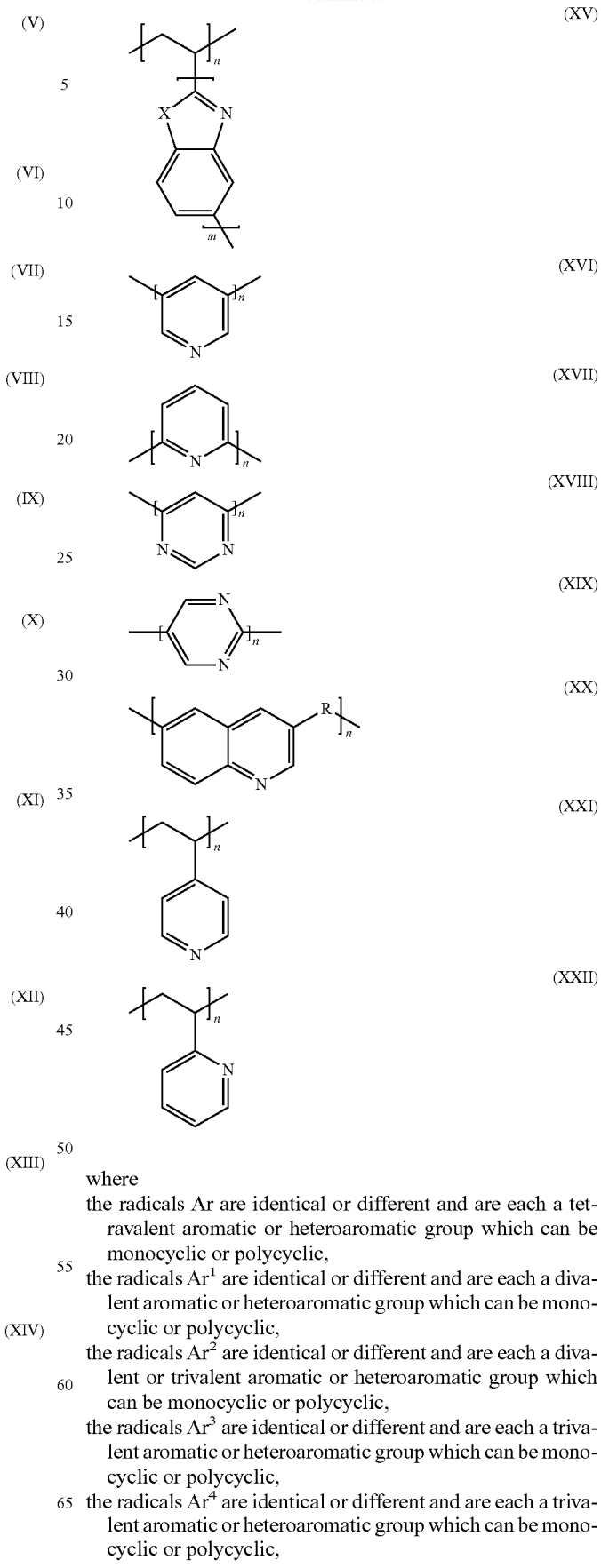

where
the radicals Ar are identical or different and are each a tetravalent aromatic or heteroaromatic group which can be monocyclic or polycyclic,
the radicals $Ar^1$ are identical or different and are each a divalent aromatic or heteroaromatic group which can be monocyclic or polycyclic,
the radicals $Ar^2$ are identical or different and are each a divalent or trivalent aromatic or heteroaromatic group which can be monocyclic or polycyclic,
the radicals $Ar^3$ are identical or different and are each a trivalent aromatic or heteroaromatic group which can be monocyclic or polycyclic,
the radicals $Ar^4$ are identical or different and are each a trivalent aromatic or heteroaromatic group which can be monocyclic or polycyclic, the radicals Ar$^5$ are identical or different and are each a tetravalent aromatic or heteroaromatic group which can be monocyclic or polycyclic, the radicals Ar$^6$ are identical or different and are each a divalent aromatic or heteroaromatic group which can be monocyclic or polycyclic, the radicals Ar$^7$ are identical or different and are each a divalent aromatic or heteroaromatic group which can be monocyclic or polycyclic, the radicals Ar$^8$ are identical or different and are each a trivalent aromatic or heteroaromatic group which can be monocyclic or polycyclic, the radicals Ar$^9$ are identical or different and are each a divalent or trivalent or tetravalent aromatic or heteroaromatic group which can be monocyclic or polycyclic, the radicals Ar$^{10}$ are identical or different and are each a divalent or trivalent aromatic or heteroaromatic group which can be monocyclic or polycyclic, the radicals Ar$^{11}$ are identical or different and are each a divalent aromatic or heteroaromatic group which can be monocyclic or polycyclic, the radicals X are identical or different and are each oxygen, sulfur or an amino group which bears a hydrogen atom, a group having 1-20 carbon atoms, preferably a branched or unbranched alkyl or alkoxy group, or an aryl group as further radical, the radicals R are identical or different and are each hydrogen, an alkyl group or an aromatic group and n, m are each an integer greater than or equal to 10, preferably greater than or equal to 100.

Preferred aromatic or heteroaromatic groups are derived from benzene, naphthalene, biphenyl, diphenyl ether, diphenylmethane, diphenyldimethylmethane, bisphenone, diphenyl sulfone, quinoline, pyridine, bipyridine, pyridazine, pyrimidine, pyrazine, triazine, tetrazine, pyrrole, pyrazole, anthracene, benzopyrrole, benzotriazole, benz-oxathiadiazole, benzoxadiazole, benzopyridine, benzopyrazine, benzopyrazidine, benzopyrimidine, benzopyrazine, benzotriazine, indolizine, quinolizine, pyridopyridine, imidazopyrimidine, pyrazinopyrimidine, carbazole, acridine, phenazine, benzoquinoline, phenoxazine, phentothiazine, acridizine, benzopteridine, phenanthroline and phenanthrene, which may also be substituted.

Ar$^1$, Ar$^4$, Ar$^6$, Ar$^7$, Ar$^8$, Ar$^9$, Ar$^{10}$, Ar$^{11}$ can have any substitution pattern; in the case of phenylene, Ar$^1$, Ar$^4$, Ar$^6$, Ar$^7$, Ar$^8$, Ar$^9$, Ar$^{10}$, Ar$^{11}$ can be, for example, ortho-, meta- or para-phenylene. Particularly preferred groups are derived from benzene and biphenylene, which may also be substituted.

Preferred alkyl groups are short-chain alkyl groups having from 1 to 4 carbon atoms, e.g. methyl, ethyl, n- or i-propyl and t-butyl groups.

Preferred aromatic groups are phenyl or naphthyl groups. The alkyl groups and the aromatic groups may be substituted.

Preferred substituents are halogen atoms such as fluorine, amino groups, hydroxy groups or short-chain alkyl groups such as methyl or ethyl groups.

Preference is given to polyazoles having recurring units of the formula (I) in which the radicals X within one recurring unit are identical.

The polyazoles can in principle also have different recurring units which differ, for example, in their radical X. However, preference is given to only identical radicals X being present in a recurring unit.

Further, preferred polyazole polymers are polyimidazoles, polybenzothiazoles, polybenzoxazoles, polyoxadiazoles, polyquinoxalines, polythiadiazoles, poly-(pyridines), poly (pyrimidines) and poly(tetrazapyrenes).

In a further embodiment of the present invention, the polymer comprising recurring azole units is a copolymer or a blend comprising at least two units of the formulae (I) to (XXII) which differ from one another. The polymers can be in the form of block copolymers (diblock, triblock), random copolymers, periodic copolymers and/or alternating polymers.

In a particularly preferred embodiment of the present invention, the polymer comprising recurring azole units is a polyazole comprising only units of the formula (I) and/or (II).

The number of recurring azole units in the polymer is preferably greater than or equal to 10. Particularly preferred polymers contain at least 100 recurring azole units.

For the purposes of the present invention, polymers comprising recurring to benzimidazole units are preferred. Some examples of extremely advantageous polymers comprising recurring benzimidazole units are represented by the following formulae:

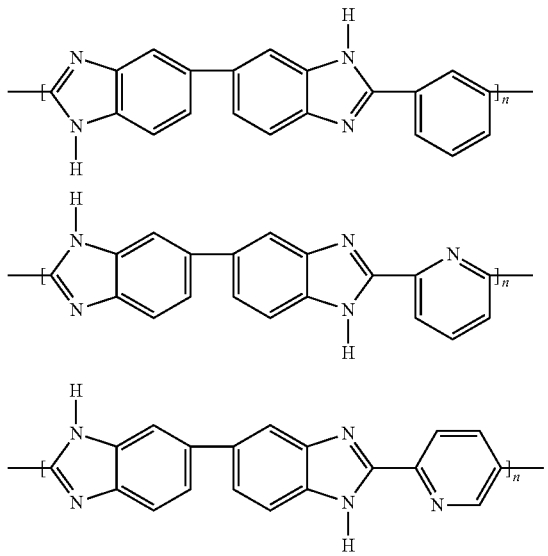

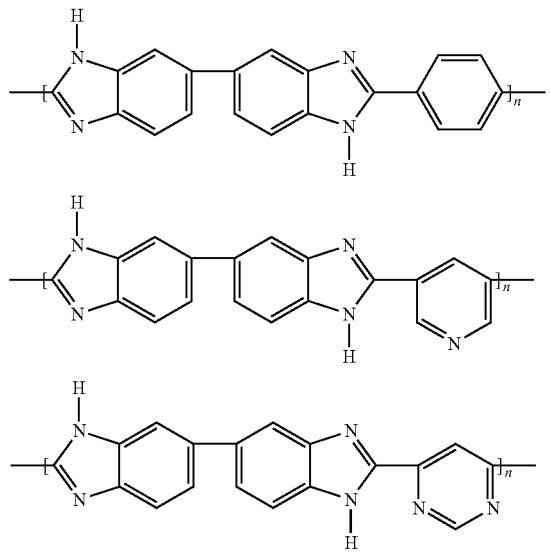

-continued
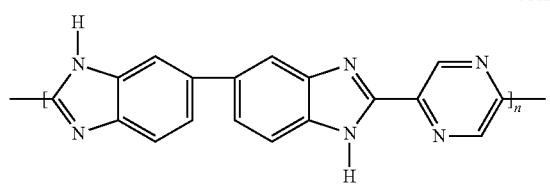 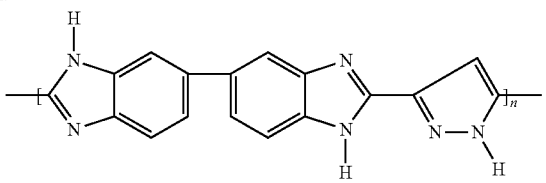
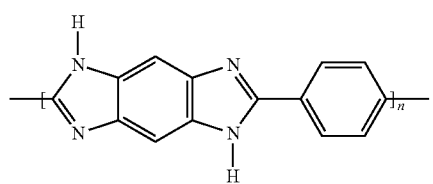 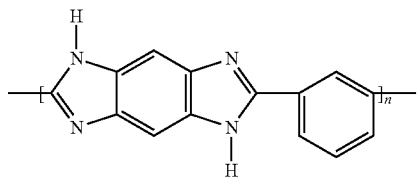
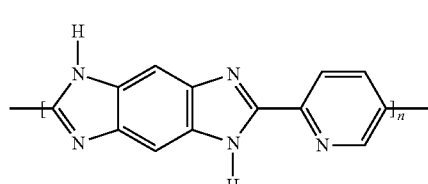 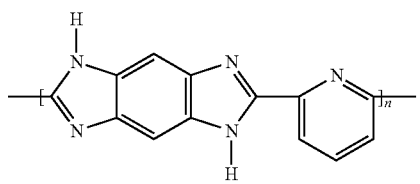
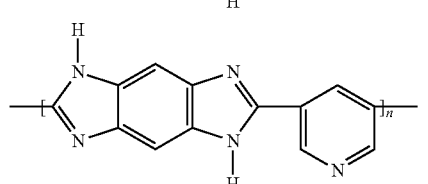 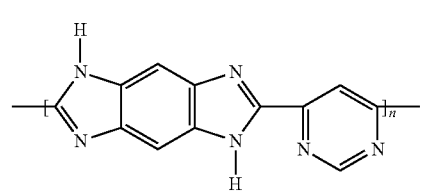
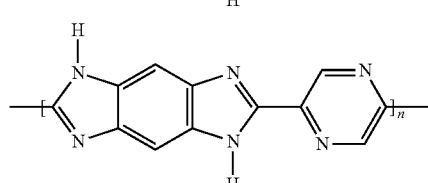 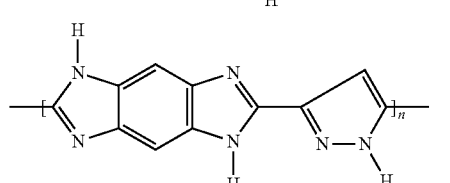
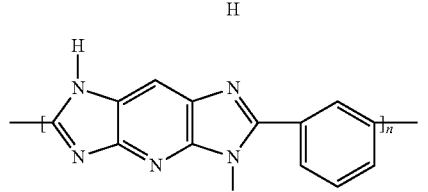 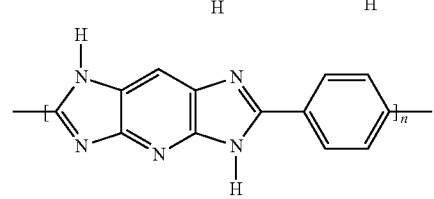
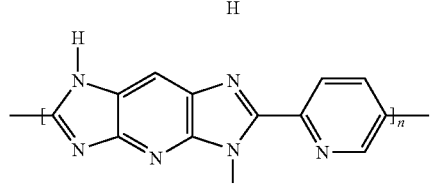 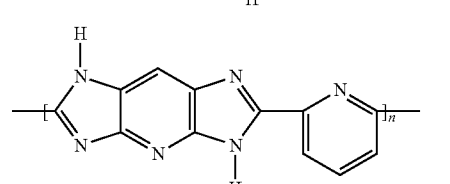
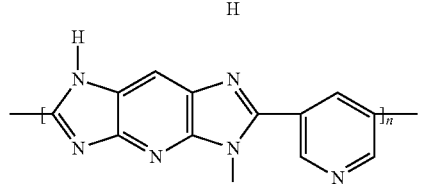 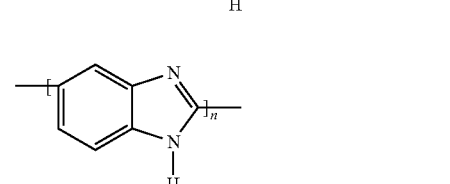
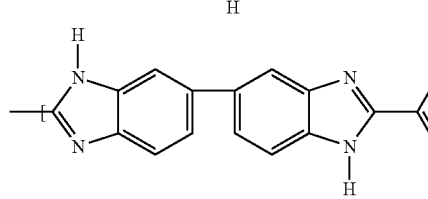 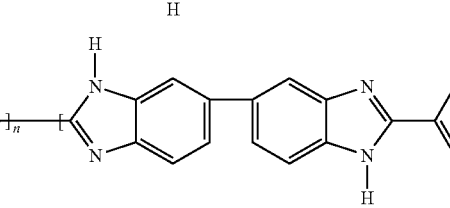

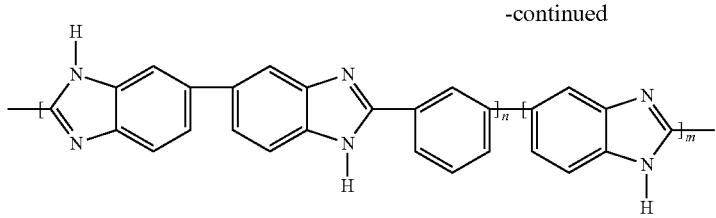

where n and m are each an integer greater than or equal to 10, preferably greater than or equal to 100.

The polyazoles obtainable by means of the process described, but in particular the polybenzimidazoles, have a high molecular weight. Measured as intrinsic viscosity, it is at least 1.4 dl/g and is thus significantly above that of commercial polybenzimidazole (IV<1.1 dl/g).

If tricarboxylic acids and/or tetracarboxylic acids capable of crosslinking are also present in the mixture obtained in step A), they effect branching/crosslinking of the polymer formed. This contributes to an improvement in the mechanical properties of the membrane formed. In particular, the membrane becomes self-supporting more quickly as a result of the crosslinking by means of any tricarboxylic acids or tetracarboxylic acids present, so that the treatment in step D) may be able to be shortened. If a very high content of tricarboxylic acids or tetracarboxylic acids capable of crosslinking is present, the after-treatment may be able to be omitted entirely.

Furthermore, it has been found that when using aromatic dicarboxylic acids (or heteroaromatic dicarboxylic acids) such as isophthalic acid, terephthalic acid, 2,5-dihydroxy-terephthalic acid, 4,6-dihydroxyisophthalic acid, 2,6-dihydroxyisophthalic acid, diphenic acid, 1,8-dihydroxynaphthalene-3,6-dicarboxylic acid, bis(4-carboxy-phenyl)ether, benzophenone-4,4'-dicarboxylic acid, bis(4-carboxyphenyl)sulfone, biphenyl-4,4'-dicarboxylic acid, 4-trifluoromethylphthalic acid, pyridine-2,5-dicarboxylic acid, pyridine-3,5-dicarboxylic acid, pyridine-2,6-dicarboxylic acid, pyridine-2,4-dicarboxylic acid, 4-phenyl-2,5-pyridinedicarboxylic acid, 3,5-pyrazole-dicarboxylic acid, 2,6-pyrimidinedicarboxylic acid, 2,5-pyrazinedicarboxylic acid, the temperature in step B) is advantageously in the range up to 300° C., preferably from 100° C. to 250° C.

The layer formation in step C) is carried out by means of measures known per se from the prior art for polymer film production (casting, spraying, spreading by doctor blade).

Possible supports are, in particular, supports which are inert under the conditions selected. However, apart from these inert supports, supports composed of polymer films which are not inert can also be used. Among this group, polymer films based on polyazoles are particularly preferred.

To adjust the viscosity, the solution can, if appropriate, be admixed with phosphoric acid (concentrated phosphoric acid, 85%). In this way, the viscosity can be set to the desired value and the formation of the membrane can be made easier.

The layer produced in step C) has a thickness of from 20 to 4000 µm, preferably from 30 to 3500 µm, in particular from 50 to 3000 µm.

The intramolecular and intermolecular structures present in step C) lead to ordered membrane formation which is responsible for the particular properties of the membrane formed.

The treatment of the membrane in step D) makes it self-supporting.

For the purposes of the present invention, "self-supporting" means that the membrane formed can be detached from the support without damage and can, if desired, subsequently be directly processed further.

The after-treatment in step D) is carried out by action of heat in the presence of atmospheric oxygen. This leads to crosslinking, so that the membrane becomes self-supporting.

The after-treatment in step D) can also be carried out exclusively by the action of heat. This variant is selected when the temperature chosen in step B) has not crosslinked tricarboxylic or tetracarboxylic acids present or has not crosslinked them completely. The temperature is selected in the range from 220° C. to 400° C., preferably from 250° C. to 380° C. The treatment time is from 5 seconds to 10 hours.

In another form of the after-treatment in step D), the treatment can be carried out using sulfuric acid, in particular dilute sulfuric acid. This treatment is known for the production of polybenzimidazole fibers for protective clothing. For this purpose, the surface to be treated is wetted with sulfuric acid or dilute sulfuric acid and is subsequently heated briefly to temperatures of up to 550° C. This ensures crosslinking of the membrane so that it becomes self-supporting. The treatment time is from 0.5 seconds to 10 minutes. This treatment is usually carried out by bringing the membrane into contact with a heated surface.

The after-treatment or crosslinking can also be effected by action of IR or NIR (IR=infrared, i.e. light having a wavelength of more than 700 nm; NIR=near IR, i.e. light having a wavelength in the range from about 700 to 2000 nm or an energy in the range from about 0.6 to 1.75 eV). A further method is irradiation with β-rays. The radiation dose is in the range from 5 to 200 kGy.

According to the invention, the concentration of the phosphoric acid is reported as mole of acid per mole of repeating unit of the polymer. For the purposes of the present invention, a concentration (mole of phosphoric acid per mole of repeating units of the formula (III), i.e. polybenzimidazole) of from 10 to 50, in particular from 12 to 40, is preferred. Such high degrees of doping (concentrations) can be obtained only with difficulty, if at all, by doping of previously produced polyazole films with commercially available ortho-phosphoric acid, since a decrease in the mechanical integrity is observed.

The polymer membrane of the invention displays improved materials properties compared to the previously known doped polymer membranes. In particular, it displays improved power compared to known doped polymer membranes. This is due, in particular, to an improved proton conductivity. At temperatures of 120° C., this is at least 0.1 S/cm, preferably at least 0.11 S/cm, in particular at least 0.12 S/cm.

To achieve a further improvement in the use properties, fillers, in particular proton-conducting fillers, and additional acids can also be added to the membrane. The addition can be carried out either in step A) or in step B) or after the polymerization in step B).

Nonlimiting examples of proton-conducting fillers are
sulfates such as $CsHSO_4$, $Fe(SO_4)_2$, $(NH_4)_3H(SO_4)_2$, $LiHSO_4$, $NaHSO_4$, $KHSO_4$, $RbSO_4$, $LiN_2H_5SO_4$, $NH_4HSO_4$, phosphates such as $Zr_3(PO_4)_4$, $Zr(HPO_4)_2$, $HZr_2(PO_4)_3$, $UO_2PO_4 \cdot 3H_2O$, $H_8UO_2PO_4$, $Ce(HPO_4)_2$, $Ti(HPO_4)_2$, $KH_2PO_4$, $NaH_2PO_4$, $LiH_2PO_4$, $NH_4H_2PO_4$, $CsH_2PO_4$, $CaHPO_4$, $MgHPO_4$, $HSbP_2O_8$, $HSb_3P_2O_{14}$, $H_5Sb_5P_2O_{20}$, polyacids such as $H_3PW_{12}O_{40} \cdot nH_2O$ (n=21-29), $H_3SiW_{12}O_{40} \cdot nH_2O$ (n=21-29), $H_xWO_3$, $HSbWO_6$, $H_3PMo_{12}O_{40}$, $H_2Sb_4O_{11}$, $HTaWO_6$, $HNbO_3$, $HTiNbO_5$, $HTiTaO_5$, $HSbTeO_6$, $H_5Ti_4O_9$, $HSbO_3$, $H_2MoO_4$, selenites and arsenides such as $(NH_4)_3H(SeO_4)_2$, $UO_2AsO_4$, $(NH_4)_3H(SeO_4)_2$, $KH_2AsO_4$, $Cs_3H(SeO_4)_2$, $Rb_3H(BeO_4)_2$, oxides such as $Al_2O_3$, $Sb_2O_5$, $ThO_2$, $SnO_2$, $ZrO_2$, $MoO_3$, silicates such as zeolites, zeolites($NH_4+$), sheet silicates, framework silicates, H-natrolites, H-mordenites, $NH_4$-analcines, $NH_4$-sodalites, $NH_4$-gallates, H-montmorillonites, acids such as $HClO_4$, $SbF_5$, fillers such as carbides, in particular SiC, $Si_3N_4$, fibers, in particular glass fibers, glass powders and/or polymer fibers, preferably ones based on polyazoles.

In addition, this membrane can further comprise perfluorinated sulfonic acid additives (0.1-20% by weight, preferably 0.2-15% by weight, very particularly preferably 0.2-10% by weight). These additives lead to an increase in power, in the vicinity of the cathode to an increase in the oxygen solubility and oxygen diffusion and to a reduction in the adsorption of phosphoric acid and phosphate onto platinum. (Electrolyte additives for phosphoric acid fuel cells. Gang, Xiao; Hjuler, H. A.; Olsen, C.; Berg, R. W.; Bjerrum, N. J. Chem. Dep. A, Tech. Univ. Denmark, Lyngby, Den. J. Electrochem. Soc. (1993), 140(4), 896-902 and Perfluorosulfonimide as an additive in phosphoric acid fuel cell. Razaq, M.; Razaq, A.; Yeager, E.; DesMarteau, Darryl, D.; Singh, S. Case Cent. Electrochem. Sci., Case West, Reserve Univ., Cleveland, Ohio, USA. J. Electrochem. Soc. (1989), 136(2), 385-90.)

Nonlimiting examples of perfluorated additives are: trifluoromethanesulfonic acid, potassium trifluoromethanesulfonate, sodium trifluoromethanesulfonate, lithium trifluoromethanesulfontate, ammonium trifluoro-methanesulfonate, potassium perfluorohexanesulfonate, sodium perfluorohexane-sulfonate, lithium perfluorohexanesulfonate, ammonium perfluorohexanesulfonate, perfluorohexanesulfonic acid, potassium nonafluorobutanesulfonate, sodium nonafluorobutanesulfonate, lithium nonafluorobutanesulfonate, ammonium nonafluorobutanesulfonate, cesium nonafluorobutanesulfonate, triethylammonium perfluorohexanesulfonate, perfluorosulfonimides and Nafion.

Furthermore, the membrane can further comprise additives which scavenge (primary antioxidants) or destroy (secondary antioxidants) the free peroxide radicals produced in the reduction of oxygen during operation and thereby improve the life and stability of the membrane and membrane-electrode unit as described in JP2001118591 A2. The mode of action and molecular structures of such additives are described in F. Gugumus in Plastics Additives, Hanser Verlag, 1990; N. S. Allen, M. Edge Fundamentals of Polymer Degradation and Stability, Elsevier, 1992; or H. Zweifel, Stabilization of Polymeric Materials, Springer, 1998.

Nonlimiting examples of such additives are: bis(trifluoromethyl)nitroxide, 2,2,-diphenyl-1-picrinylhydrazyl, phenols, alkylphenols, sterically hindered alkylphenols such as Irganox, aromatic amines, sterically hindered amines such as Chimassorb; sterically hindered hydroxylamines, sterically hindered alkylamines, sterically hindered hydroxylamines, sterically hindered hydroxylamine ethers, phosphites such as Irgafos, nitrosobenzene, methyl-2-nitrosopropane, benzophenone, benzaldehyde tert-butyl nitron, cysteamine, melanines, lead oxides, manganese oxides, nickel oxides, cobalt oxides.

Possible fields of use of the doped polymer membranes of the invention include, inter alia, use in fuel cells, in electrolysis, in capacitors and in battery systems. Owing to their property profile, the doped polymer membranes are preferably used in fuel cells.

The present invention also provides a membrane-electrode unit comprising at least one polymer membrane according to the invention. For further information on membrane-electrode units, reference may be made to the specialist literature, in particular the U.S. Pat. No. 4,191,618, U.S. Pat. No. 4,212,714 and U.S. Pat. No. 4,333,805. The disclosure of the above-mentioned references [U.S. Pat. No. 4,191,618, U.S. Pat. No. 4,212,714 and U.S. Pat. No. 4,333,805] in respect of the structure and the production of membrane-electrode units and also the electrodes, gas diffusion layers and catalysts to be selected is incorporated by reference into the present description.

In one variant of the present invention, the membrane formation in step C) can be carried out directly on the electrode rather than on a support. The treatment according to step 1D) can in this way be correspondingly shortened, since it is no longer necessary for the membrane to be self-supporting. Such a membrane is also provided by the present invention.

The present invention further provides an electrode provided with a proton-conducting polymer coating which is based on polyazoles and is obtainable by a is process comprising the steps A) mixing of one or more aromatic tetramino compounds with one or more aromatic carboxylic acids or esters thereof which contain at least two acid groups per carboxylic acid monomer, or mixing of one or more aromatic and/or heteroaromatic diaminocarboxylic acids, in phosphoric acid to form a solution and/or dispersion, B) heating of the solution and/or dispersion obtained in step A) to temperatures of up to 350° C., preferably up to 280° C., to form the polyazole polymer, C) application of a layer using the mixture from step B) to an electrode, D) if appropriate, treatment of the membrane formed in step C).

The above-described variants and preferred embodiments also apply to this subject matter, so that they will not be repeated at this point.

The coating after step C) has a thickness of from 2 to 3000 μm, preferably from 3 to 2000 μm, in particular from 5 to 1500 μm.

The after-treatment in step D) is carried out for the purpose of fully polymerizing any oligomers still present.

Such a coated electrode can be installed in a membrane-electrode unit which, if appropriate, has at least one polar membrane according to the invention.

In a further variant, a catalytically active layer can be applied to the membrane according to the invention and this catalytically active layer can be joined to a gas diffusion layer. For this purpose, a membrane is formed according to steps A) to D) and the catalyst is applied. These structures are also provided by the present invention.

Furthermore, the formation of the membrane according to steps A) to D) can also be carried out on a support or a support film to which the catalyst has previously been applied. After removal of the support or the support film, the catalyst is present on the membrane according to the invention. These structures are also provided by the present invention.

The present invention provides a polymer film which is based on polyazoles and is obtainable by a process comprising the steps A) mixing of one or more aromatic tetramino compounds with one or more aromatic carboxylic acids or esters thereof which contain at least two acid groups per carboxylic acid monomer, or mixing of one or more aromatic and/or heteroaromatic diaminocarboxylic acids, in phosphoric acid to form a solution and/or dispersion,
B) heating of the solution and/or dispersion obtained in step A) to temperatures of up to 350° C., preferably up to 280° C., to form the polyazole polymer,
C) application of a layer using the mixture from step B) a support,
D) treatment of the membrane formed in step C) until it is self-supporting,
E) detachment of the membrane formed in step C) from the support,
F) removal of the phosphoric acid present and drying.

Subsequent to step E), the phosphoric acid present in the polymer film is removed in step F). This is carried out by means of a treatment liquid in the temperature range from room temperature (20° C.) to the boiling point of the treatment liquid (at atmospheric pressure).

Treatment liquids used for the purposes of the invention and for the purposes of step F) are solvents which are liquid at room temperature [i.e. 20° C.] and are selected from the group consisting of alcohols, ketones, alkanes (aliphatic and cycloaliphatic), ethers (aliphatic and cycloaliphatic), glycols, esters, carboxylic acids, with the above members of the group being able to be halogenated, water and mixtures thereof.

Preference is given to using C1-C10-alcohols, C2-C5-ketones, C1-C10-alkanes (aliphatic and cycloaliphatic), C2-C6-ethers (aliphatic and cycloaliphatic), C2-C5-esters, C1-C3-carboxylic acids, dichloromethane, water and mixtures thereof.

The treatment liquid introduced in step F) is subsequently removed again. This is preferably achieved by drying at a temperature and pressure chosen as a function of the partial vapor pressure of the treatment liquid. Drying is usually carried out at atmospheric pressure and temperatures in the range from 20° C. to 200° C. More gentle drying can also be carried out under reduced pressure. In place of drying, the membrane can also be dabbed off and thus freed of excess treatment liquid. The order is not critical.

Subsequent to the treatment according to step F) the polymer film can be additionally crosslinked on the surface by the action of heat in the presence of atmospheric oxygen. This hardening of the film surface achieves an additional improvement in the properties. This treatment can partly or completely replace the above drying or can be combined with it.

Crosslinking can also, as indicated above, be effected by action of IR or NIR light or by means of β-rays.

Furthermore, a thermal after-treatment with sulfuric acid as described above can be carried out subsequent to the treatment according to step F). This leads to a further improvement in the use properties of the surface.

The polymer film of the invention has improved materials properties compared to the previously known polymer films.

Furthermore, not only does the polymer film of the invention display the known advantages of separation membranes based on polyazoles, e.g. high thermal stability and resistance to chemicals, but the separation membranes according to the invention have improved mechanical properties as a result of a higher molecular weight which lead to increased long-term stability and life and also an improved separation behavior. A further advantage is, in particular, that these polymer films do not contain any impurities which are costly to remove or cannot be removed completely.

Such separation membranes can be produced as dense polymer films, porous hollow fiber membranes or as porous, open-celled polymer films, if desired with a compact covering layer.

To produce a porous membrane, the polymer solution from step A) can additionally contain a pore former such as glycerol. In the treatment in step F), known porous structures are formed by solvent replacement. Depending on the chosen composition of the precipitant, different morphologies of the separation membranes can be obtained in this way. The following structures are preferred for separation applications: i) symmetrical, porous structure, ii) unsymmetrical porous structure having denser polymer close to one membrane surface.

Scanning electron micrographs of such particularly suitable structures of polybenzimidazole membranes are disclosed in Journal of Membrane Science, Volume 20, 1984, pages 147-66.

Such phase inversion membranes and structures are known to those skilled in the art. Membranes having a symmetrical porous structure are employed as separation or filtration membranes for filtration of air and gas or for microfiltration or ultrafiltration of liquids. Membranes having an unsymmetrical, porous structure can be utilized for reverse osmosis in a variety of applications, in particular desalination of water, dialysis or processing of gases.

A particularly advantageous application is the separation of hydrogen and carbon dioxide from gas mixtures in combination with a porous metallic support. Alternative technologies for $CO_2$ separation require cooling of the gas to 150° C. because of the low thermal stability of the polymer membrane, resulting in a reduction in the efficiency. The polyazole-based separation membranes of the invention can be operated continuously at temperatures up to 400° C. and thus lead to an increase in the yield and a reduction in costs.

For further information on separation membranes based on polyazoles, reference may be made to the specialist literature, in particular the patents WO 98/14505; U.S. Pat. No. 4,693,815; U.S. Pat. No. 4,693,824; U.S. Pat. No. 375,262; U.S. Pat. No. 3,737,042; U.S. Pat. No. 4,512,894; U.S. Pat. No. 448,687; U.S. Pat. No. 3,841,492. The disclosure of the above-mentioned references in respect of the structure and production of separation membranes is incorporated by reference into the present description. In particular, such separation membranes can be produced in the form of flat films or as hollow fiber membranes.

To achieve a further improvement in the use properties, fillers can be additionally added to the polymer films. The addition can be carried out either in step A and/or B or after the polymerization (step B).

Nonlimiting examples of such fillers are
oxides such as $Al_2O_3$, $Sb_2O_5$, $ThO_2$, $SnO_2$, $ZrO_2$, $MoO_3$
silicates such as zeolites, zeolites($NH_4+$), sheet silicates, framework silicates, H-natrolites, H-mordenites, $NH_4$-analcines, $NH_4$-sodalites, $NH_4$-gallates, H-montmorilonites
fillers such as carbides, in particular SIC, $Si_3N_4$, fibers, in particular glass fibers, glass powders and/or polymer fibers, preferably ones based on polyazoles.

Furthermore, the polymer film can also contain additives which scavenge or destroy any free radicals produced during use in gas filtration.

Nonlimiting examples of such additives are: bis(trifluoromethyl)nitroxide, 2,2-diphenyl-1-picrylhydrazyl, phenols, alkylphenols, sterically hindered alkylphenols such as Irganox, aromatic amines, sterically hindered amines such as Chimassorb; sterically hindered hydroxylamines, sterically hindered alkylamines, sterically hindered hydroxylamines, sterically hindered hydroxylamine ethers, phosphates such as Irgafos, nitrosobenzene, methyl-2-nitrosopropane, benzophenone, benzaldehyde tert-butyl nitrone, cysteamine, melanines, lead oxides, manganese oxides, nickel oxides, cobalt oxides.

Possible fields of use of the polymer films of the invention include, inter alia, use as filter medium in gas filtration and separation or gas purification, and also in reverse osmosis, as substrates for flexible electric circuits, as battery separators, as protective film for electric cables, as insulator in electric components and devices such as capacitors, as protective film for metal surfaces and other surfaces.

The present invention therefore also provides a polymer which is based on polyazoles as per the above features, whose molecular weight expressed as intrinsic viscosity is at least 1.4 dl/g and which is obtainable by a process comprising the steps A) mixing of one or more aromatic tetramino compounds with one or more aromatic carboxylic acids or esters thereof which contain at least two acid groups per carboxylic acid monomer, or mixing of one or more aromatic and/or heteroaromatic diaminocarboxylic acids, in phosphoric acid to form a solution and/or dispersion, B) heating of the mixture obtainable according to step A) under inert gas to temperatures of up to 350° C., preferably up to 280° C., to form the polyazole polymer, C) precipitation of the polymer formed in step B) and isolation and drying of the polymer powder obtained.

The preferred embodiments for the steps A) and B) have been described above, so that they will not be repeated at this point.

The precipitation in step C) can be achieved by introducing the material from step B) into a precipitation bath. This introduction is generally carried out in the temperature range from room temperature (20° C.) to the boiling point of the precipitation liquid (at atmospheric pressure).

Precipitation liquids used for the purposes of the invention and for the purposes of step C) are solvents which are liquid at room temperature [i.e. 20° C.] and are selected from the group consisting of alcohols, ketones, alkanes (aliphatic and cycloaliphatic), ethers (aliphatic and cycloaliphatic), esters, carboxylic acids, with the above members of the group being able to be halogenated, water and mixtures thereof.

Preference is given to using C1-C10-alcohols, C2-C5-ketones, C1-C10-alkanes (aliphatic and cycloaliphatic), C2-C6-ethers (aliphatic and cycloaliphatic), C2-C5-esters, C1-C3-carboxylic acids, dichloromethane, water and mixtures thereof.

The precipitated polymer is subsequently freed of the precipitation liquid again. This is preferably achieved by drying at a temperature and pressure selected as a function of the partial vapor pressure of the precipitation liquid. Drying is usually carried out at atmospheric pressure and temperatures in the range from 20° C. to 200° C. Gentler drying can also be carried out under reduced pressure. The drying method is not subject to any restrictions.

The polyazoles obtainable by means of the process described, but in particular the polybenzimidazoles, have a high molecular weight. Measured as intrinsic viscosity, this is at least 1.4 dl/g, preferably at least 1.5 dl/g, and is thus significantly above that of commercial polybenzimidazole (IV<1.1 dl/g).

The polymer powders obtained in this way are suitable, in particular, as raw material for producing shaped bodies, in particular films and fibers.

The present invention further provides a polymer fiber which is based on polyazoles, whose molecular weight expressed as intrinsic viscosity is at least 1.4 dl/g and which is obtainable by a process comprising the steps A) mixing of one or more aromatic tetramino compounds with one or more aromatic carboxylic acids or esters thereof which contain at least two acid groups per carboxylic acid monomer, or mixing of one or more aromatic and/or heteroaromatic diaminocarboxylic acids, in phosphoric acid to form a solution and/or dispersion, B) heating of the mixture obtained in step A) to temperatures of up to 350° C., preferably up to 280° C., to form the polyazole polymer, C) extrusion of the polyazole polymer formed in step B) to form fibers, D) introduction of the fibers formed in step C) into a liquid bath, E) isolation and drying of the fibers obtained.

The preferred embodiments for the steps A) and B) has been presented above, so that they will not be repeated at this point.

The extrusion in step C) can be carried out by means of all known fiber formation methods. The fibers formed can be continuous filaments or, if fiber formation is carried out by a method analogous to the "melt blow method", have the character of staple fibers. The thicknesses of the fibers formed are not subject to any restrictions, so that monofilaments, i.e. wire-like fibers, can also be produced. Apart from these, hollow fibers can also be produced. The desired thickness is determined by the envisaged use of the fiber. The entire handling of the fibers formed can be carried out by means of known fiber technologies.

After extrusion in step C), the fibers formed are introduced into a precipitation bath. This introduction is carried out in the temperature range from room temperature (20° C.) to the boiling point of the precipitation liquid (at atmospheric pressure).

Precipitation liquids used for the purposes of the invention and for the purposes of step C) are solvents which are liquid at room temperature [i.e. 20° C.] and are selected from the group consisting of alcohols, ketones, alkanes (aliphatic and cycloaliphatic), ethers (aliphatic and cycloaliphatic), esters, carboxylic acids, with the above members of the group being able to be halogenated, water and mixtures thereof.

Preference is given to using C1-C10-alcohols, C2-C5-ketones, C1-C10-alkanes (aliphatic and cycloaliphatic), C2-C6-ethers (aliphatic and cycloaliphatic), C2-C5-esters, C1-C3-carboxylic acids, dichloromethane, water and mixtures thereof.

The fiber is subsequently freed of the precipitation liquid again. This is preferably achieved by drying at a temperature and pressure selected as a function of the partial vapor pressure of the precipitation liquid. Drying is usually carried out at atmospheric pressure and temperatures in the range from 20° C. to 200° C. Gentler drying can also be carried out under reduced pressure. The drying method is not subject to any restrictions.

The treatment in the precipitation bath can lead to formation of porous structures, Depending on the application, these may be desirable for the subsequent use.

General Measurement Methods:

Measurement Methods for IEC

The conductivity of the membrane depends strongly on the content of acid groups expressed as the ion-exchange capacity (IEC). To measure the ion-exchange capacity, a specimen having a diameter of 3 cm is stamped out and placed in a glass beaker containing 100 ml of water. The acid liberated is titrated with 0.1M NaOH. The specimen is subsequently taken up, excess water is dabbed off and the specimen is dried at 160° C. for 4 hours. The dry weight, $m_0$, is then determined gravimetrically to a precision of 0.1 mg. The ion-exchange capacity is then calculated from the consumption of 0.1M NaOH to the first titration end point, $V_1$ in ml, and the dry weight, $m_0$ in mg, according to the following formula:

$$IEC = V_1 * 300/m_0$$

Measurement Method for Specific Conductivity

The specific conductivity is measured by means of impedance spectroscopy in a 4-pole arrangement in the potentiostatic mode using platinum electrodes (wire, 0.25 mm diameter). The distance between the current-collecting electrodes is 2 cm. The spectrum obtained is evaluated using a simple model comprising a parallel arrangement of an ohmic resistance and a capacitor. The specimen cross section of the membrane doped with phosphoric acid is measured immediately before mounting of the specimen. To measure the temperature dependence, the measurement cell is brought to the desired temperature in an oven and the temperature is regulated by means of a Pt-100 resistance thermometer positioned in the immediate vicinity of the specimen. After the temperature has been reached, the specimen is maintained at this temperature for 10 minutes before commencement of the measurement.

The invention claimed is:

1. A process for manufacturing a polymer film which comprises the steps
  A) mixing of one or more aromatic tetramino compounds with one or more aromatic carboxylic acids or esters thereof which contain at least two acid groups per carboxylic acid monomer, or mixing of one or more aromatic and/or heteroaromatic diaminocarboxylic acids, in phosphoric acid to form a solution and/or dispersion wherein said phosphoric acid does not contain any polyphosphoric acid,
  B) heating of the solution and/or dispersion obtained in step A) to temperatures of up to 350° C. to form a polyazole polymer,
  C) applying a layer using the mixture from step B) to a support,
  D) treating the membrane formed in step C) until it is self-supporting,
  E) detaching of the membrane formed in step C) from the support,
  F) removing the phosphoric acid present and drying
  wherein the heating in step B) is done in such a manner that the phosphoric acid being present is not converted into polyphosphoric acid.

2. The process as claimed in claim 1, wherein the aromatic tetramino compound is 3,3',4,4'-tetraminobiphenyl, 2,3,5,6-tetraminopyridine, 1,2,4,5-tetraminobenzene, bis(3,4-diaminophenyl)sulfone, bis(3,4-diaminophenyl)ether, 3,3',4,4'-tetra-aminobenzophenone, 3,3',4,4'-tetraminodiphenylmethane or 3,3',4,4'-tetra-aminodiphenyldimethylmethane.

3. The process as claimed in claim 1, wherein said aromatic dicarboxylic acid is isophthalic acid, terephthalic acid, phthalic acid, 5-hydroxyisophthalic acid, 4-hydroxyisophthalic acid, 2-hydroxyterephthalic acid, 5-aminoisophthalic acid, 5-N,N-dimethylaminoisophthalic acid, 5-N,N-diethylaminoisophthalic acid, 2,5-dihydroxyterephthalic acid, 2,5-dihydroxyisophthalic acid, 2,3-dihydroxyisophthalic acid, 2,3-dihydroxyphthalic acid, 2,4-dihydroxyphthalic acid, 3,4-dihydroxyphthalic acid, 3-fluorophthalic acid, 5-fluoroisophthalic acid, 2-fluoroterephthalic acid, tetrafluorophthalic acid, tetrafluoroisophthalic acid, tetrafluoroterephthalic acid, 1,4-naphthalenedicarboxylic acid, 1,5-naphthalenedicarboxylic acid, 2,6-naphthalenedicarboxylic acid, 2,7-naphthalenedicarboxylic acid, diphenic acid, 1,8-dihydroxynaphthalene-3,6-dicarboxylic acid, bis(4-carboxyphenyl)ether, benzophenone-4,4'-dicarboxylic acid, bis(4-dicarboxyphenyl)sulfone, biphenyl-4,4'-dicarboxylic acid, 4-trifluoromethylphthalic acid, 2,2-bis(4-carboxyphenyl)hexafluoropropane, 4,4'-stilbenedicarboxylic acid, 4-carboxycinnamic acid, or their C1-C20-alkyl esters or C5-C12-aryl esters, or their acid anhydrides or acid chlorides.

4. The process as claimed in claim 1, wherein the aromatic carboxylic acid is tricarboxylic acids, tetracarboxylic acids or their C1-C20-alkyl esters or C5-C12-aryl esters or their acid anhydrides or their acid chlorides.

5. The process as claimed in claim 1, wherein the aromatic carboxylic acid is tetracarboxylic acids, their C1-C20-alkyl esters or C5-C12-aryl esters or their acid anhydrides or their acid chlorides.

6. The process as claimed in claim 4, wherein the content of tricarboxylic acids or tetracarboxylic acids (based on dicarboxylic acid used) is from 0.5 to 20 mol %.

7. The process as claimed in claim 1, wherein the aromatic carboxylic acids are heteroaromatic dicarboxylic acids, tricarboxylic acids or tetracarboxylic acids which contain at least one nitrogen, oxygen, sulfur or phosphorus atom in the aromatic.

8. The process as claimed in claim 1, wherein the polyazole-based polymer comprising recurring azole units of the general formula (I)-(XXII) or a mixture thereof,

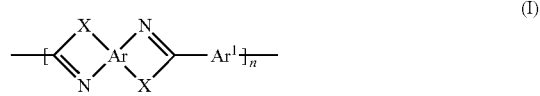

(I)

(II)

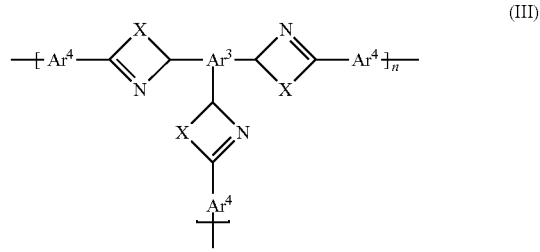

(III)

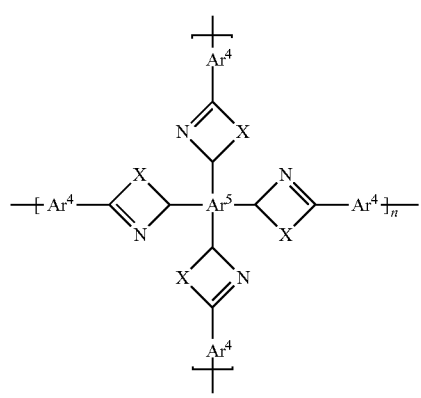
(IV)
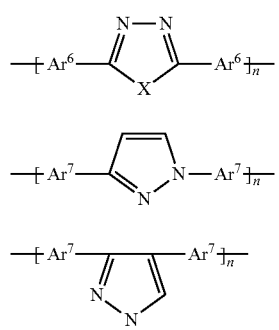
(V)
(VI)
(VII)
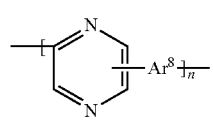
(VIII)
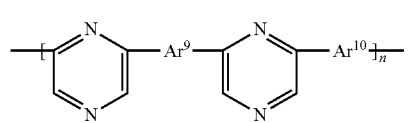
(IX)
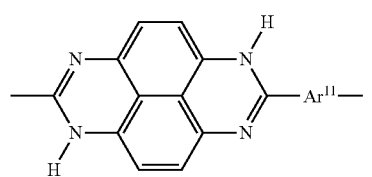
(X)
(XI)
(XII)
(XIII)
(XIV)
(XV)
(XVI)
(XVII)
(XVIII)
(XIX)
(XX)
(XXI)
(XXII)

where
the radicals Ar are identical or different and are each a tetravalent aromatic or heteroaromatic group which can be monocyclic or polycyclic,
the radicals $Ar^1$ are identical or different and are each a divalent aromatic or heteroaromatic group which can be monocyclic or polycyclic,
the radicals $Ar^2$ are identical or different and are each a divalent or trivalent aromatic or heteroaromatic group which can be monocyclic or polycyclic,
the radicals $Ar^3$ are identical or different and are each a trivalent aromatic or heteroaromatic group which can be monocyclic or polycyclic,
the radicals $Ar^4$ are identical or different and are each a trivalent aromatic or heteroaromatic group which can be monocyclic or polycyclic,
the radicals $Ar^5$ are identical or different and are each a tetravalent aromatic or heteroaromatic group which can be monocyclic or polycyclic,
the radicals $Ar^6$ are identical or different and are each a divalent aromatic or heteroaromatic group which can be monocyclic or polycyclic,
the radicals $Ar^7$ are identical or different and are each a divalent aromatic or heteroaromatic group which can be monocyclic or polycyclic,
the radicals $Ar^8$ are identical or different and are each a trivalent aromatic or heteroaromatic group which can be monocyclic or polycyclic,
the radicals $Ar^9$ are identical or different and are each a divalent or trivalent or tetravalent aromatic or heteroaromatic group which can be monocyclic or polycyclic,
the radicals $Ar^{10}$ are identical or different and are each a divalent or trivalent aromatic or heteroaromatic group which can be monocyclic or polycyclic,
the radicals $Ar^{11}$ are identical or different and are each a divalent aromatic or heteroaromatic group which can be monocyclic or polycyclic,
the radicals X are identical or different and are each oxygen, sulfur or an amino group which bears a hydrogen atom, a group having 1-20 carbon atoms, the radicals R are identical or different and are each hydrogen, an alkyl group or an aromatic group and
n and m are each an integer greater than or equal to 10, is formed in step B).

9. The process as claimed in claim 1, wherein a polymer selected from the group consisting of polybenzimidazole, poly(pyridines), poly(pyrimidines), polyimidazoles, polybenzothiazoles, polybenzoxazoles, polyoxadiazoles, polyquinoxalines, polythiadiazoles and poly(tetrazapyrenes) is formed in step B).

10. The process as claimed in claim 1, wherein the viscosity is adjusted by addition of phosphoric acid after step B) and before step C).

11. The process as claimed in claim 1, wherein a layer having a thickness of from 20 to 4000 μm is produced in step C).

12. The process as claimed in claim 1, wherein the membrane produced in step C) is treated in step D) until the membrane is self-supporting and can be detached from the support without damage.

13. The process as claimed in claim 1, wherein the membrane produced in step C) is treated in step D) by the action of heat in the presence of atmospheric oxygen.

14. The process as claimed in claim 1, wherein the membrane produced in step C) still contains tricarboxylic or tetracarboxylic acids which are crosslinked in step D).

15. The process as claimed in claim 1, wherein the membrane produced in step C) is crosslinked by treatment with sulfuric acid in step D).

16. The process as claimed in claim 1, wherein the membrane produced in step C) is crosslinked by action of IR or NIR light or by irradiation with β-rays in step D).

17. The process as claimed in claim 1, wherein the membrane has a layer comprising a catalytically active component.

18. The process as claimed in claim 1, wherein the formation of the membrane according to steps A) to D) is carried out on the support or a support film on which a catalyst is present, and the catalyst is located on the membrane according to the invention after removal of the support or the support film.

19. The process as claimed in claim 1, wherein the removal of the phosphoric acid in step F) is carried out by means of a treatment liquid.

20. The process as claimed in claim 1, wherein the heating is done in a closed reactor so that the phosphoric acid being present is not converted into polyphosphoric acid.

21. The process as claimed in claim 1, wherein a polymer comprising recurring benzimidazole units of the formula

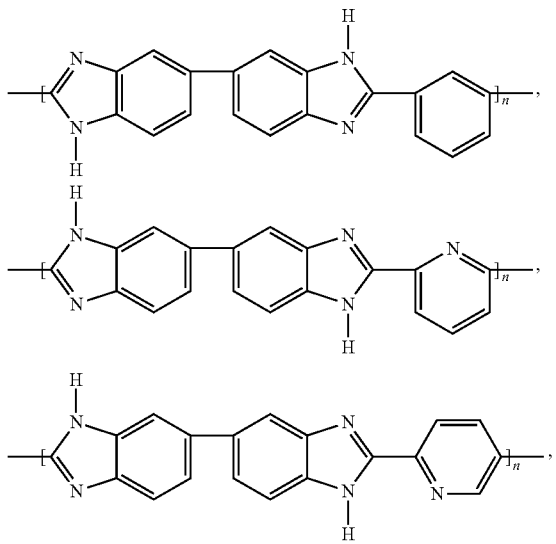

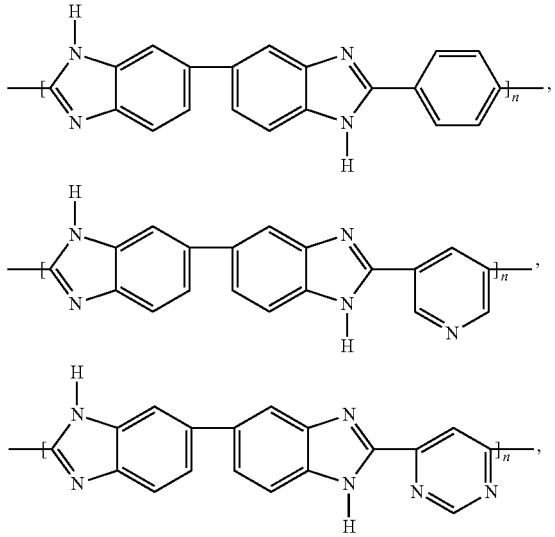

-continued
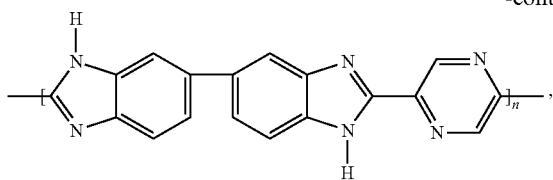
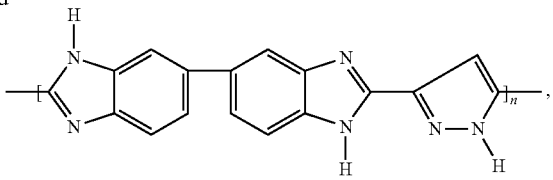
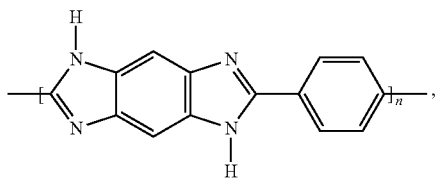
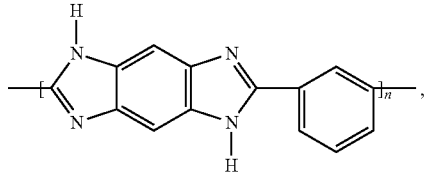
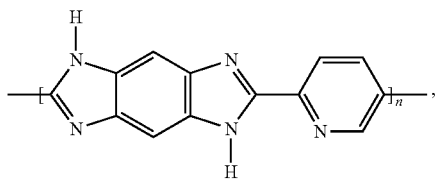
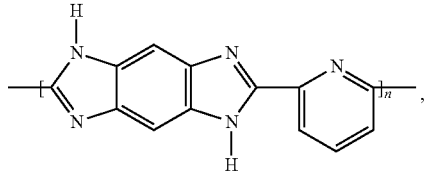
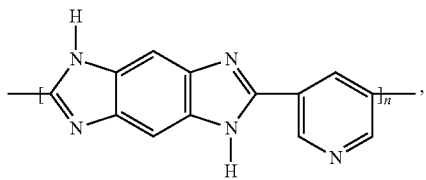
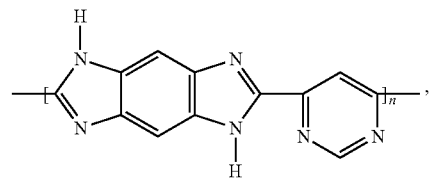
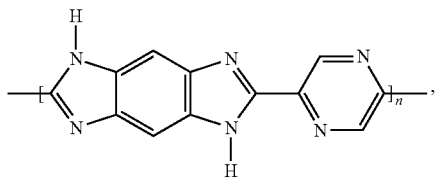
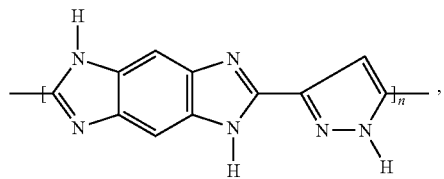
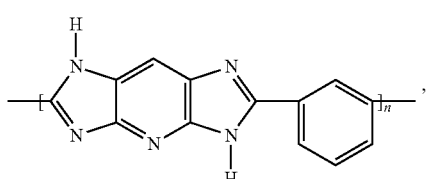
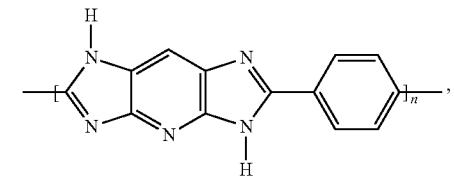
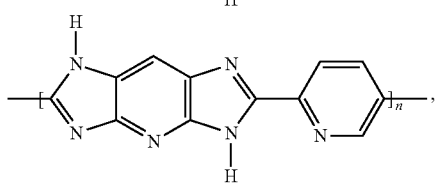
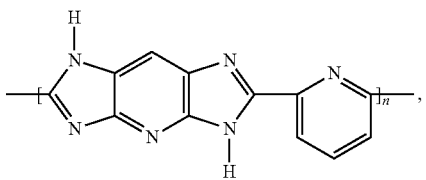

-continued
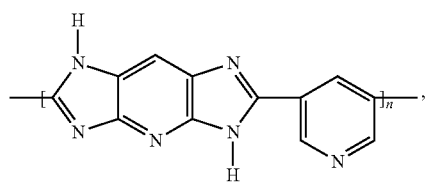
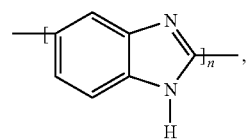
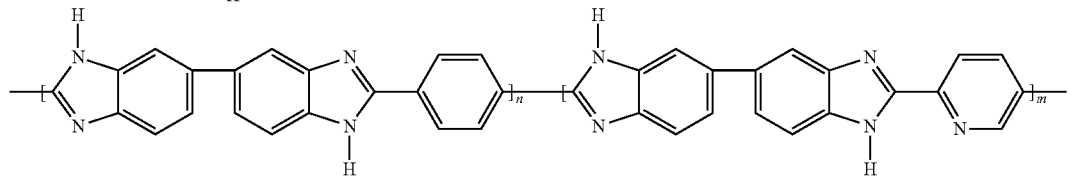
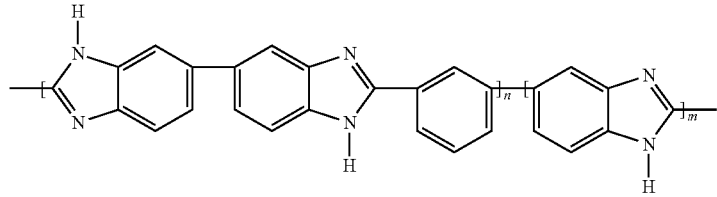
or
where n and m are each an integer greater than or equal to 10, is formed in step B).
22. The process as claimed in claim 1, wherein water formed by the polycondensation, if any, is completely or partially removed.
* * * * *